United States Patent
Corbeil et al.

(10) Patent No.: US 8,784,559 B2
(45) Date of Patent: Jul. 22, 2014

(54) METHOD AND APPARATUS FOR CONTINUOUS CRYSTAL GROWTH

(75) Inventors: James L. Corbeil, Knoxville, TN (US); Troy Marlar, Knoxville, TN (US); Piotr Szupryczynski, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 986 days.

(21) Appl. No.: 12/878,326

(22) Filed: Sep. 9, 2010

(65) Prior Publication Data

US 2012/0060748 A1   Mar. 15, 2012

(51) Int. Cl.
*C30B 15/02* (2006.01)

(52) U.S. Cl.
USPC ............... 117/15; 117/13; 117/19; 117/32; 117/218

(58) Field of Classification Search
USPC .................. 117/13, 15, 19, 32, 218
See application file for complete search history.

(56) References Cited

U.S. PATENT DOCUMENTS

| | | | |
|---|---|---|---|
| 4,036,595 A | 7/1977 | Lorenzini et al. | |
| 4,282,184 A | 8/1981 | Fiegl et al. | |
| 4,350,560 A * | 9/1982 | Helgeland et al. | 117/35 |
| 4,410,494 A | 10/1983 | Fiegl et al. | |
| 4,659,421 A | 4/1987 | Jewett | |
| 4,662,982 A * | 5/1987 | Jablonski et al. | 117/35 |
| 5,820,649 A | 10/1998 | Ogure et al. | |
| 5,958,133 A | 9/1999 | Boulaev | |
| 6,261,364 B1 | 7/2001 | Arai et al. | |
| 7,635,414 B2 | 12/2009 | Bender | |
| 2001/0008114 A1 * | 7/2001 | Falster et al. | 117/3 |

* cited by examiner

*Primary Examiner* — Bob M Kunemund
(74) *Attorney, Agent, or Firm* — Peter Kendall (57) ABSTRACT

A Czochralski ("CZ") single-crystal growth process system continuously grows crystal boules in a chamber furnace during a single thermal cycle. Finished boules are transferred from the furnace chamber, without need to cool the furnace, to an adjoining cooling chamber for controlled cooling. Controlled cooling is preferably accomplished by transporting boules along a path having an incrementally decreasing temperature. In order to maximize crystal boule yield in a single furnace thermal cycle, the crucible assembly may be recharged with crystal growth aggregate and/or slag may be discharged during the crystal boule growth process without opening the furnace.

23 Claims, 6 Drawing Sheets

METHOD AND APPARATUS FOR CONTINUOUS CRYSTAL GROWTH

BACKGROUND OF THE DISCLOSURE

1. Field of the Invention

The invention relates to a method and apparatus to grow crystals for electronics and photonics applications. More particularly the present invention relates to a method and apparatus employing the Czochralski ("CZ") single-crystal growth process, wherein multiple crystal boules may be grown and cooled during a single heating cycle of the crystal growth furnace.

2. Description of the Prior Art

In the known Czochralski ("CZ") single-crystal growth process a sealed furnace structure having a noble metal crucible containing a crystal forming granular aggregate is heated in an inert atmosphere, forming a melt. A crystal growth seed rod is placed in contact with the melt and withdrawn at a speed that promotes growth of a single crystal boule. After the crystal boule is grown the furnace is cooled slowly in order to minimize risk of boule cracking or creation of other cooling induced imperfections. The cooled furnace chamber is opened, so that the boule may be removed for further processing. After cooling and boule removal, the furnace chamber and growth components are readied for another crystal growth cycle. Due to cooling constraints, considerable time (often many days) is required to complete a complete crystal growth cycle and ready the growth furnace for the next growth cycle.

In order to reduce cycle time between single crystal boule growth cycles, in the past it has been suggested to grow multiple crystal boules in a single crystal production cycle. One suggested solution has been to grow single boules serially in a single crucible and transferring grown crystal boules to a holding area in the furnace. Another suggested serial processing solution was to create a two-part furnace having the crucible in the first part and a removable growth rod/boule extraction tower removable from the first part. Upon completion of a boule growth, the tower section would be removed (potentially wasting heat as the furnace is opened and discharging inert gas normally occupying the furnace chamber when practicing the CZ process) and replenished with a new tower section. In either of these serial processing solutions, when the serial growth run was completed the furnace was cooled and multiple completed boules extracted. The furnace would then be prepared for another growth cycle.

Another suggested batch processing solution has been to grow simultaneously multiple crystals in parallel with multiple crucibles in a single furnace. Again, upon completion of the parallel growth cycle the furnace would be cooled, the multiple boules extracted and the furnace serviced for commencement of another production cycle.

In preparation for a subsequent growth cycle the furnace and components are serviced and repaired, as is often necessary, due to the high-temperature thermal stresses on the components. Individual thermal stress events which are exacerbated by thermal cycling from initial cold state to heated state and back to cold state. Crucible assembly repair and servicing is critical because it is subject to very high thermal stress, and thus is prone to warping and cracking. Additionally after a crystal growth cycle a cooled crucible contains re-solidified residual melt and slag that is difficult and time consuming to remove without damaging the crucible. When the noble metal crucible can no longer be repaired due to cracks and warpage, it must be scrapped and recycled due to the value of its material.

The same equipment servicing challenges exist for a serial or parallel multiple boule processing production cycle as does for a single boule processing cycle furnace. Additional new challenges for multiple boule processing cycles include: recharging spent melt, if multiple boules are to be extracted from a single crucible; and waste slag removal from the crucible as more melt is added to a growth crucible. As slag builds in a growth crucible, less crucible volume is available for new melt.

A past solution for providing recharge melt for crystal formation crucibles has been to melt solid aggregate in a first melting crucible and then feed the melt to a downstream crystal formation crucible. Two common structural geometries for the dual melting/crystal formation crucibles have included coaxially nested crucibles or inclusion of siphon/gravity feed tubes from the melt crucible to the crystal formation crucible.

While past continuous crystal growth systems addressed crystal melt replenishment, they did not propose solutions for crucible slag accumulation resulting from melt replenishment. As is known by those skilled in the art, variations in slag concentration can negatively impact uniformity of dopant distribution within a melt at the crystal-melt interface. Deviations in dopant distribution in a single boule (e.g. variations at the top of the boule vs. the bottom of the boule) or in a series of boules will negatively impact uniformity of boule optical and scintillation properties.

There are needs in the crystal growth field to: (i) reduce boule fabrication cycle time; (ii) reduce heating energy costs associated with operation of a CZ crystal formation furnace; (iii) reduce service and maintenance costs associated with operation of CZ crystal formation furnaces and (iv) achieve boule uniformity of optical and scintillation properties within a boule or series of fabricated boules.

SUMMARY

Accordingly, an object of the present invention is to create and operate a CZ process crystal growth furnace that operates continuously to fabricate a plurality of crystal boules in a single thermal cycle without shutting down and cooling the furnace in order to extract completed boules, so that time is not wasted waiting for the furnace to cool to a desired temperature.

It is another object of the present invention to create and operate a CZ process crystal growth furnace that does not waste energy by engaging in repetitive furnace heating/cooling cycles during boule formation and removal.

It is yet another object of the present invention to create and operate a CZ process crystal growth furnace that reduces service costs associated with repetitive furnace heating/cooling cycles: e.g. that unduly warp or crack crucibles or require removal of hardened slag and melt remnants from crucibles between thermal cycles.

Lastly, it is an object of the present invention to create and operate a CZ process crystal growth furnace continuously for multiple boule fabrication that recharges depleted crystal growth melt and removes slag during a single furnace operational thermal cycle.

These and other objects are achieved in accordance with the present invention by the CZ furnace apparatus and methods of operation of embodiments of the present invention.

An embodiment of the present invention features a Czochralski ("CZ") single-crystal growth process system continuously grows crystal boules in a chamber furnace during a single thermal cycle. Finished boules are transferred from the furnace chamber, without need to cool the furnace, to an adjoining cooling chamber for controlled cooling. Controlled cooling is preferably accomplished by transporting boules along a path having an incrementally decreasing temperature. In order to maximize crystal boule yield in a single furnace thermal cycle, the crucible assembly may be recharged with crystal growth aggregate and/or slag may be discharged during the crystal boule growth process without opening the furnace.

More particularly, an embodiment of the present invention features a crystal fabrication system for continuously growing multiple crystal boules utilizing the Czochralski ("CZ") crystal growth process. The system has a furnace chamber capable of growing a plurality of crystal boules in a single thermal cycle of the furnace chamber, and includes a crucible assembly retaining a heated crystal melt. A crystal growth rod assembly is in communication with the crystal melt, capable of forming and drawing a crystal boule from the melt. A cooling chamber is directly coupled to the furnace chamber, capable of receiving and storing a plurality of crystal boules from the furnace chamber during a single thermal cycle of the furnace chamber. A boule transfer mechanism transfers boules from the furnace chamber to the cooling chamber without the need to cool the furnace chamber prior to transfer.

An embodiment of the present invention is also directed to a method for continuously growing multiple crystal boules utilizing the Czochralski ("CZ") crystal growth process by growing a plurality of crystal boules in a furnace chamber during a single thermal cycle. The chamber includes a crucible assembly retaining a heated crystal melt and a crystal growth rod assembly in communication with the crystal melt, capable of forming and drawing a crystal boule from the melt. The method is further practiced by providing a cooling chamber directly coupled to the furnace chamber, capable of receiving and storing a plurality of crystal boules from the furnace chamber during a single thermal cycle of the furnace chamber; and transferring grown boules from the furnace chamber to the cooling chamber with a transfer mechanism without the need to cool the furnace chamber prior to transfer.

Additionally the cooling chamber may have a temperature regulation system. The temperature regulation system may decrease cooling chamber temperature from proximal to distal the furnace chamber. In order to enhance continuous crystal growth the system may further include a crystal aggregate supply coupled to the crucible assembly, enabling the crucible assembly to replenish heated crystal melt. The crucible assembly may have an aggregate melt crucible for receiving aggregate supply and pre-melting same, that is in fluid communication with a crystal growth crucible. A slag discharge mechanism may be operatively coupled to the crucible assembly. The crucible assembly may have trunions coupled to the furnace chamber for tilting a portion thereof, so that slag may be discharged to the slag discharge mechanism.

The objects and features of embodiments of the present invention can be utilized by one skilled in the art of fabrication and operation of CZ crystal growth furnaces jointly and severally in any desired combination.

BRIEF DESCRIPTION OF THE DRAWINGS

The teachings of exemplary embodiments of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

After considering the following description, those skilled in the art will clearly realize that the exemplary teachings of embodiments of the invention can be readily utilized in continuous crystal growth fabrication furnace.

Continuous Crystal Fabrication System Overview

Figure 1:
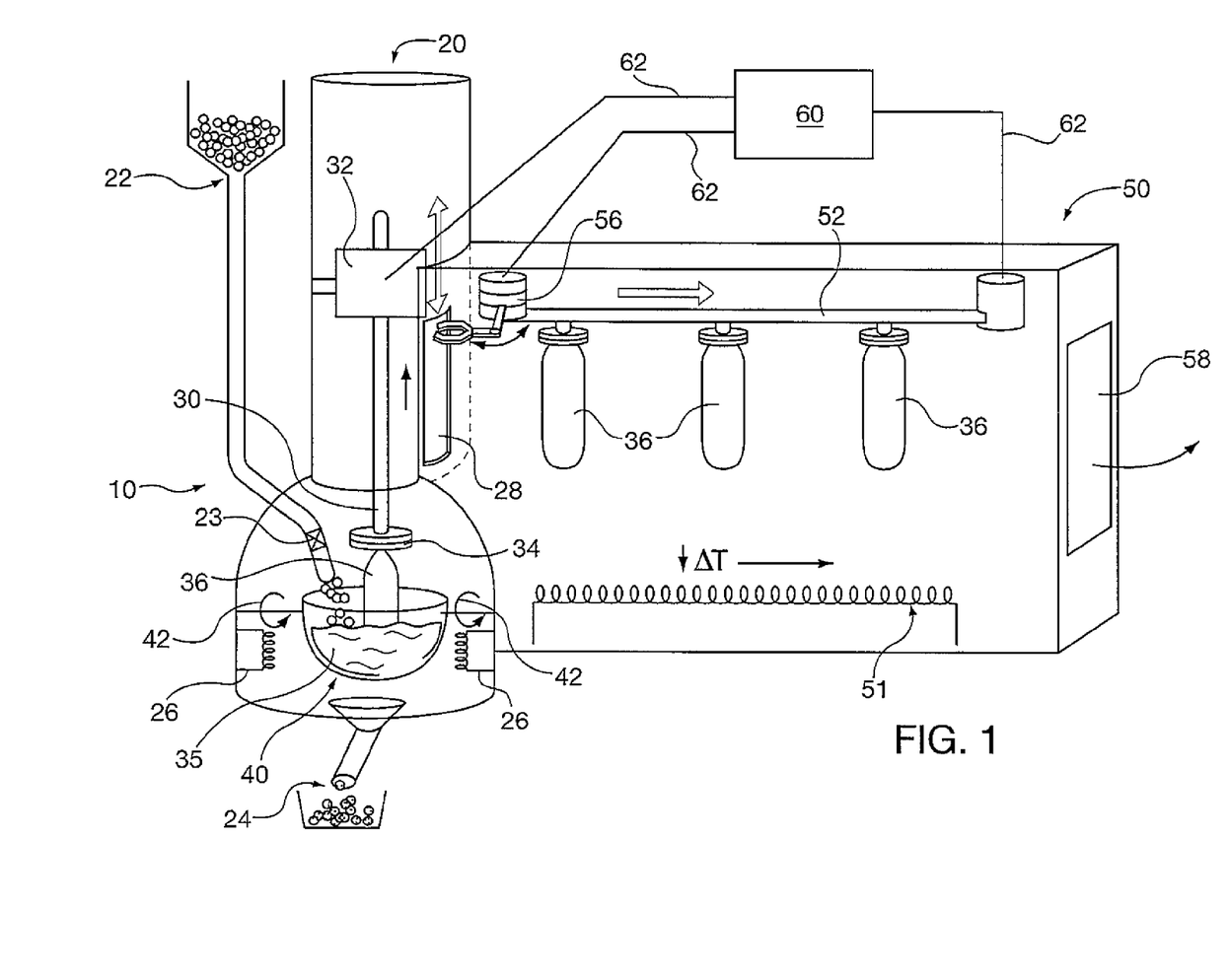
FIG. 1 is a schematic perspective view of a crystal fabrication furnace of an embodiment of the present invention, having a furnace chamber and a crystal cooling chamber.

FIG. 1 shows generally a perspective view of the crystal fabrication system 10 in accordance with an embodiment of the present invention. Furnace chamber 20 grows crystal boules 36 from melted aggregate using the well known Czochralski ("CZ") crystal growth process. The fabrication system 10 in accordance with an embodiment of the present invention is intended to grow crystal boules 36 continuously in a single thermal cycle, rather than grow only a single boule in a thermal cycle. To this end, the system 10 is capable of recharging crystal growing aggregate via an aggregate supply 22, having a supply valve 23, and extract melt slag via a slag collector 24 chute on an ongoing basis. The furnace 20 has a furnace heater 26 that may be a radio frequency (RF) heater. Furnace door 28 provides an exit portal for completed crystal boules 36, while maintaining furnace heat and retaining inert gas normally resident in the furnace 20 when practicing the CZ crystal formation process.

Figure 4:
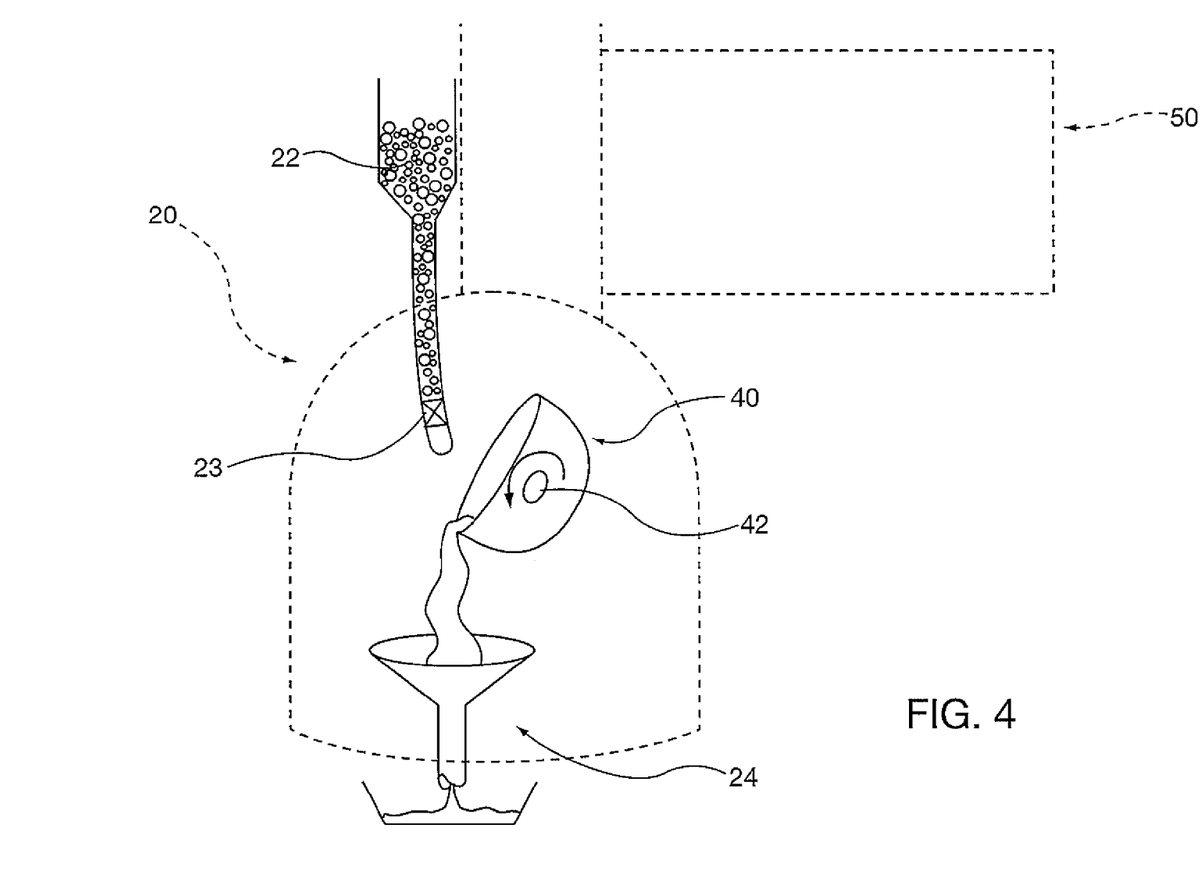
FIG. 4 is a schematic perspective view of a crucible slag dumping operation of an embodiment of the present invention.

In the crystal growth apparatus, seed growth rod 30, seed rod driver 32 and seed growth tip 34 are of known construction, and facilitate growth and extraction of a crystal boule 36 from a crystal formation melt 35. The crucible assembly 40, to be described in greater detail, is mounted on a swiveling trunion 42, that enables slag pour-off to the slag collector 24, as shown in FIG. 4. A plurality of crucibles, each having its own crystal growth apparatus, may be included in a single furnace 20, in order to facilitate parallel boule 36 generation during a single furnace thermal cycle.

Crystal cooling chamber 50 is coupled to the furnace chamber 20, and is capable of receiving cooling multiple crystal boules 36 in a furnace single thermal cycle through the furnace door 28. A double door furnace airlock (not shown) may be incorporated in the system to minimize loss of inert gas from the furnace chamber 20 during boule transfer to the cooling chamber 50. Coupling of chamber 50 directly to the furnace 20 minimizes heat loss from the furnace during boule 36 transfer and also inhibits loss of inert gas normally occupying the furnace chamber during boule growth in the CZ process. Cooling chamber 50 may include, but is not required to include, a cooling chamber heater 51 that can be configured to provide a continuous decreasing temperature gradient ΔT along the length of the cooling chamber. Alternatively, the cooling chamber may be configured to receive serially a plurality of boules 36 from the furnace chamber 20, maintain all received boules at a designated temperature with the cooling chamber heater 51, and then cool all boules simultaneously by reducing the heater temperature. As another alternative, boules 36 may be received serially in the cooling chamber 50 and allowed to cool to the chamber's ambient temperature without the assistance of a cooling chamber heater 51.

Figure 2:
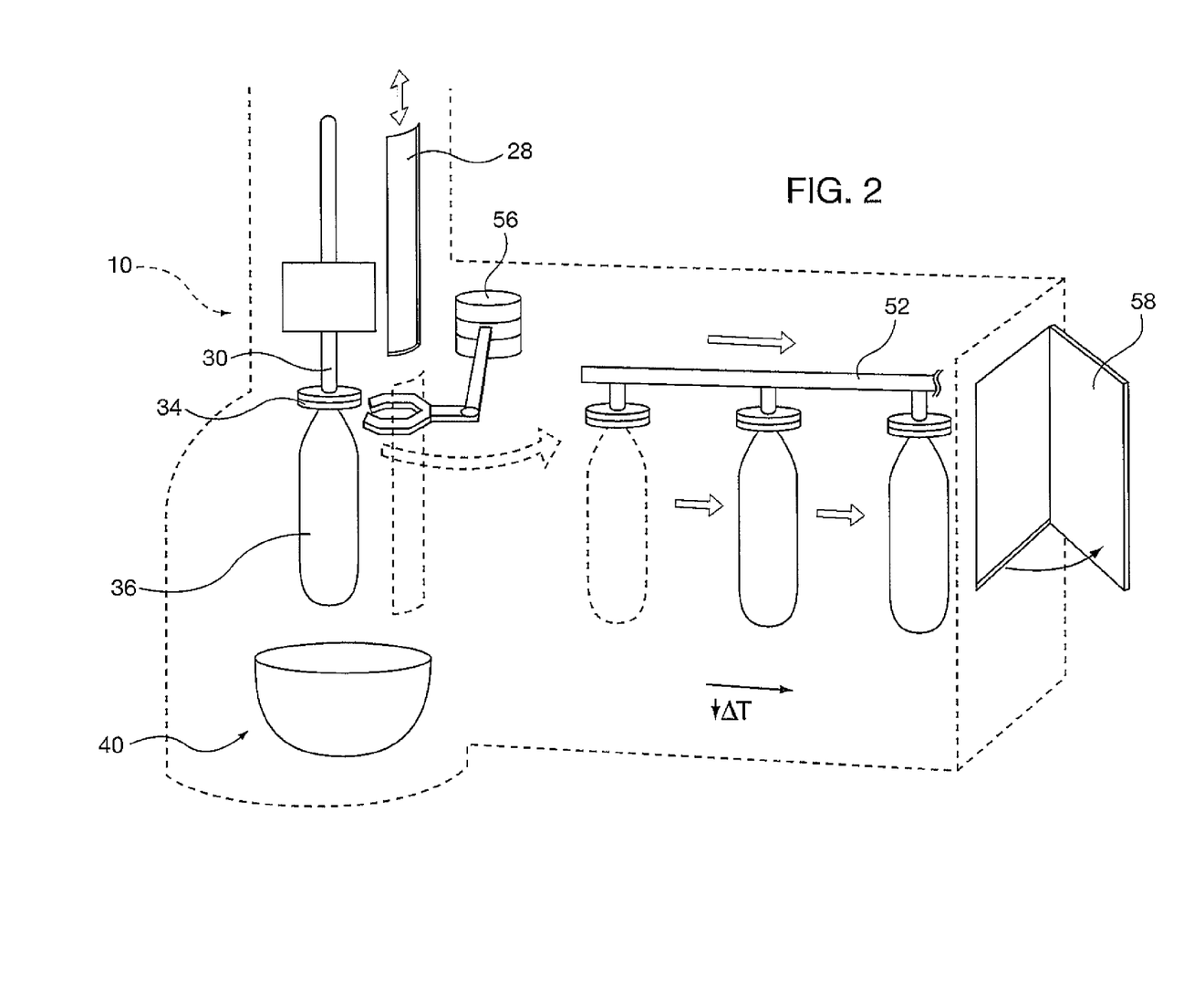
FIG. 2 is a perspective view similar to that of FIG. 1 showing crystal boule transport from the furnace chamber to the cooling chamber.
Figure 6:
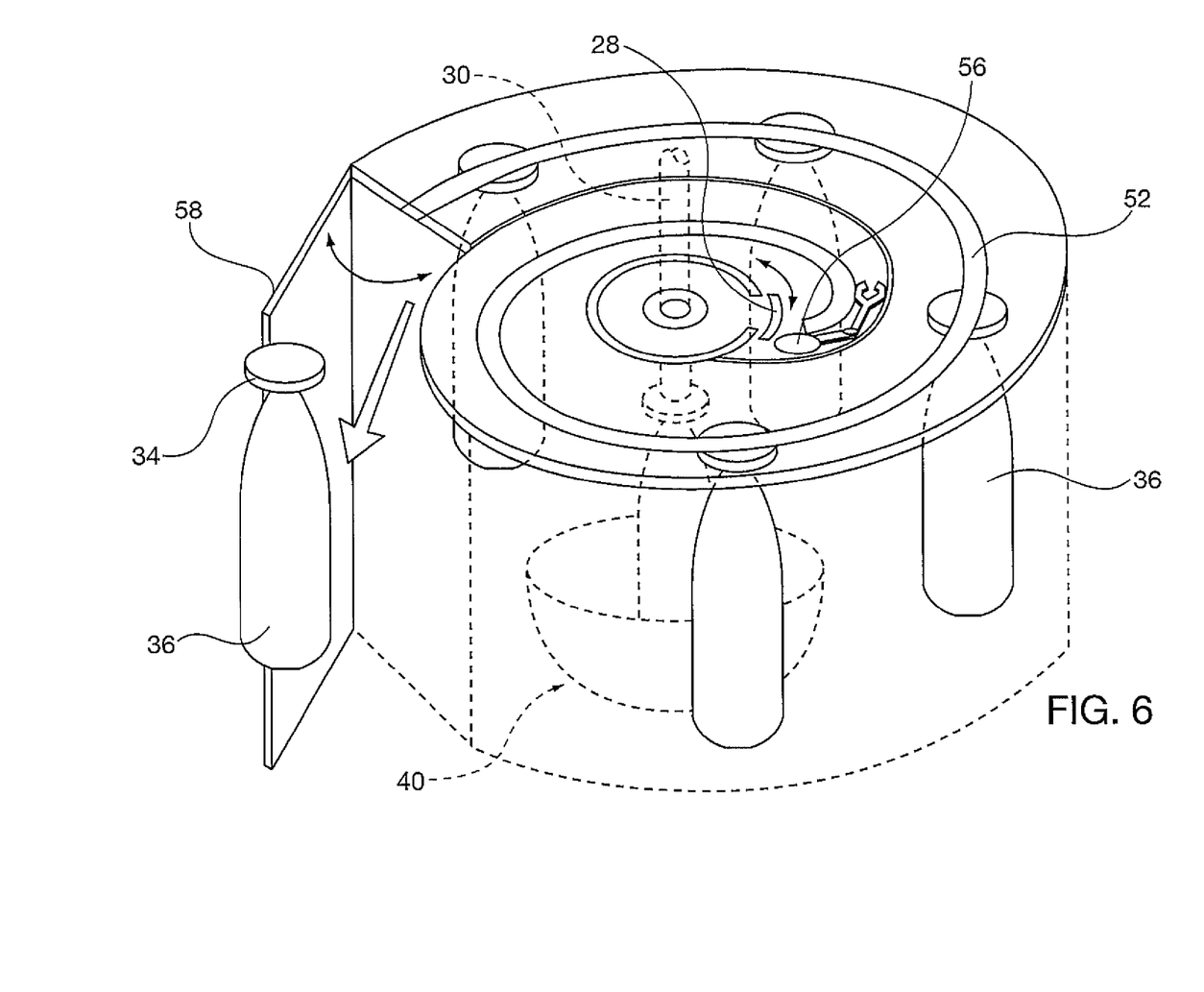
FIG. 6 is a schematic perspective view of an alternative embodiment of a crystal cooling chamber of the present invention, having a generally helical crystal boule transport path.

In the cooling chamber 50 embodiments shown in FIGS. 1, 2 and 6, the cooling boules 36 preferably are transported by track 52, driven by track drive 54. Boule transport arm 56 removes completed boules 36 from the furnace chamber 20 via furnace door 28 and deposits them on track 52. Boules 36 exit the cooling chamber 50 via cooling chamber exit door 58. Controller 60 controls operation of the boule track driver 54 and the boule transport arm 56 by way of communications pathways 62. The communication pathways 62 may be hard wired, a computer bus or a wireless communication system. An exemplary controller may be a programmable logic controller ("PLC") executing software commands, a "soft" PLC that emulates PLC functions on a personal computer, or a personal computer. Alternatively, boules 36 may be removed from the furnace chamber 20 and stored in the cooling chamber 50 without a driven rack 52.

The cooling chamber 50 is shown schematically in FIGS. 1, 2 and 4 as having a linear planform, but any shape planform may be selected by those skilled in the art. The helical planform cooling chamber 50 shown in FIG. 6 has additional advantages of smaller foot print for a given length of boule track 52 and efficient heat retention by minimizing sidewall surface area exposure. As previously referenced, if it is desired to minimize inert gas loss from the furnace chamber 20 during boule 36 transfer to the cooling chamber 50, a double furnace door 28 and airlock (not shown) may be constructed, with possible need to relocate the boule transfer arm 56 to the airlock. Alternatively, the cooling chamber 50 may also be filled with the same inert gas as the furnace chamber 20, so that no inert gas escapes to atmosphere during boule 36 transfer. If the cooling chamber 50 is also filled with inert gas a double cooling chamber exit door 58 with airlock may be constructed (not shown).

Continuous Crystal Formation Crucible

Figure 3:
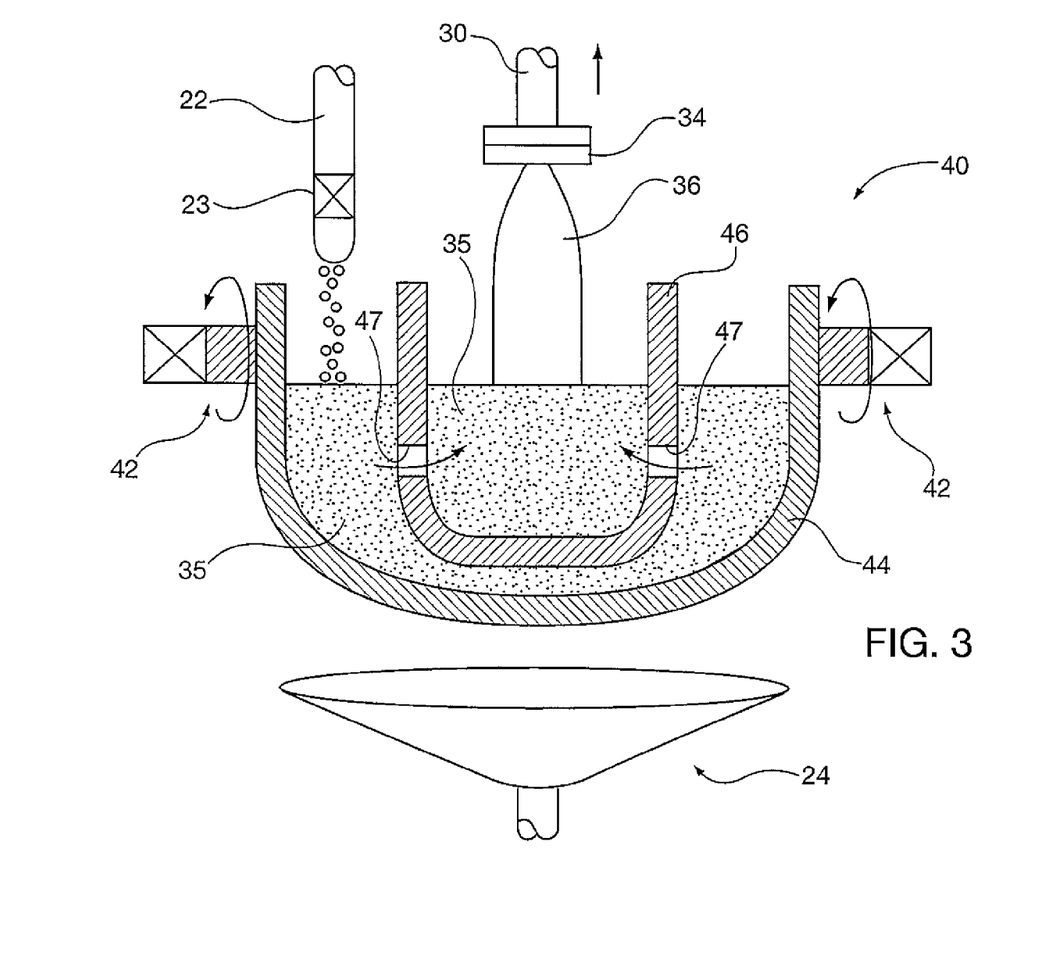
FIG. 3 is an schematic elevational view of a first crucible embodiment of the present invention.
Figure 5:
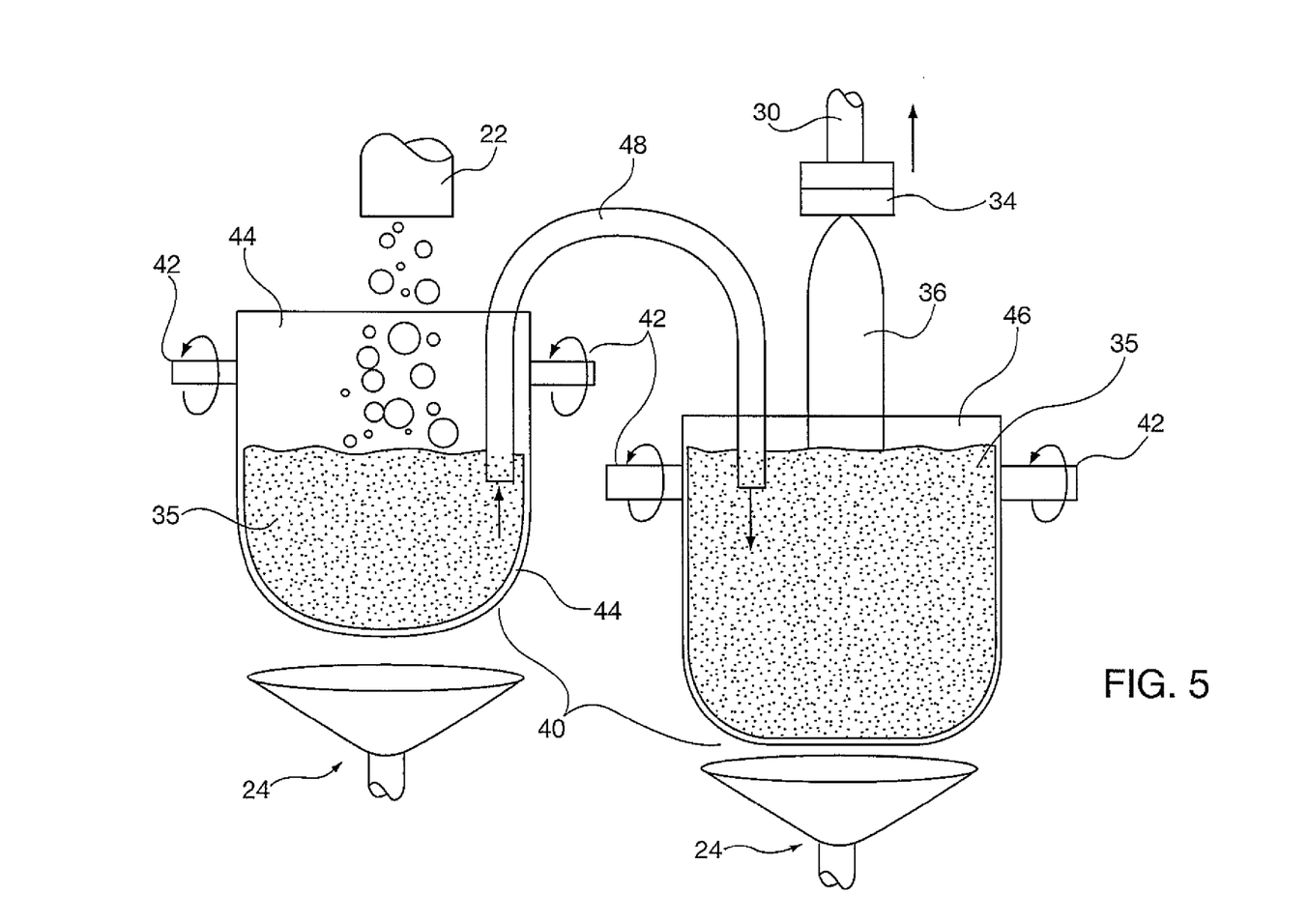
FIG. 5 is an schematic elevational view of a second crucible embodiment of the present invention.

Two embodiments of crucible assemblies 40 are shown in FIGS. 3 and 5. Both embodiments provide for a crucible swiveling trunion 42, for cleaning unwanted slag from a crucible assembly 40, as shown in FIG. 4. An aggregate melt crucible 44 converts recycled and new melt aggregate into a molten mass necessary for fabrication of semiconductor devices. The melted aggregate is routed to a crystal growth crucible 46. Two distinct embodiments of crucible assemblies 40 are shown respectively in FIGS. 3 and 5. The first embodiment of the crucible assembly 40 is shown in FIG. 3, wherein the aggregate melt crucible 44 retains the crystal growth crucible 46 in generally concentric fashion. Crystal growth crucible ports 47 enable the melt to flow into the growth crucible and refresh its contents as boules 36 are formed. In an alternative embodiment of FIG. 5, the respective aggregate melt crucible 44 and crystal growth crucible 46 are arrayed in tandem. An interconnecting siphon tube 48 enables melt to flow from the aggregate melt crucible 44 to the crystal growth crucible 46.

Although various embodiments which incorporate the teachings of the present invention have been shown and described in detail herein, those skilled in the art can readily devise many other varied embodiments that still incorporate these teachings.

What is claimed is:

1. A crystal fabrication system for continuously growing multiple crystal boules utilizing the Czochralski ("CZ") crystal growth process, comprising:
    a furnace chamber capable of growing a plurality of crystal boules in a single thermal cycle thereof, including:
        a crucible assembly retaining a heated crystal melt therein, and
        a crystal growth rod assembly in communication with the crystal melt, capable of forming and drawing a crystal boule from the melt;
    a cooling chamber directly coupled to the furnace chamber, capable of receiving and storing a plurality of crystal boules from the furnace chamber during a single thermal cycle of the furnace chamber; and
    a boule transfer mechanism for transferring boules from the furnace chamber to the cooling chamber without the need to cool the furnace chamber prior to transfer; and
    a slag discharge mechanism operatively coupled to the crucible assembly, enabling the crucible assembly to discharge slag therefrom.

2. The system of claim 1, the cooling chamber further comprising a cooling temperature regulation system.

3. The system of claim 2, wherein the cooling temperature regulation system decreases a cooling chamber temperature from proximal to distal the furnace chamber.

4. The system of claim 2, wherein the cooling chamber further comprising a track for transporting boules therein from proximal to distal the furnace chamber.

5. The system of claim 4, wherein the cooling temperature regulation system decreases cooling chamber temperature from proximal to distal the furnace chamber.

6. The system of claim 1, the cooling chamber further comprising a track for transporting boules therein.

7. The system of claim 1, further comprising a crystal aggregate supply coupled to the crucible assembly, enabling the crucible assembly to replenish heated crystal melt therein.

8. The system of claim 1, wherein the crucible assembly further comprises an aggregate melt crucible in fluid communication with a crystal growth crucible.

9. The system of claim 1, wherein the crucible assembly further comprises trunions coupled to the furnace chamber for tilting at least a portion thereof.

10. A crystal fabrication system for continuously growing multiple crystal boules utilizing the Czochralski ("CZ") crystal growth process, comprising:
    a furnace chamber capable of growing a plurality of crystal boules in a single thermal cycle thereof, including:
        a crucible assembly retaining a heated crystal melt therein, and
        a crystal growth rod assembly in communication with the crystal melt, capable of forming and drawing a crystal boule from the melt;
    a cooling chamber directly coupled to the furnace chamber, capable of receiving and storing a plurality of crystal boules from the furnace chamber during a single thermal cycle of the furnace chamber, the cooling chamber including a cooling temperature regulation system;
    a boule transfer mechanism for transferring boules from the furnace chamber to the cooling chamber without the need to cool the furnace chamber prior to transfer; and
    a crystal aggregate supply coupled to the crucible assembly, enabling the crucible assembly to replenish heated crystal melt therein.

11. The system of claim 10, wherein the cooling temperature regulation system decreases cooling chamber temperature from proximal to distal the furnace chamber.

12. The system of claim 10, the cooling chamber further comprising a track for transporting boules therein from proximal to distal the furnace chamber.

13. The system of claim 11, wherein the cooling temperature regulation system decreases cooling chamber temperature from proximal to distal the furnace chamber.

14. The system of claim 10, further comprising a slag discharge mechanism operatively coupled to the crucible assembly, enabling the crucible assembly to discharge slag therefrom.

15. The system of claim 10, wherein the crucible assembly further comprises an aggregate melt crucible in fluid communication with a crystal growth crucible.

16. The system of claim 10, wherein the crucible assembly further comprises trunions coupled to the furnace chamber for tilting a portion thereof.

17. A method for continuously growing multiple crystal boules utilizing the Czochralski ("CZ") crystal growth process, comprising:
   growing a plurality of crystal boules in a furnace chamber during a single thermal cycle thereof, the chamber including:
      a crucible assembly retaining a heated crystal melt therein, and
      a crystal growth rod assembly in communication with the crystal melt, capable of forming and drawing a crystal bottle from the melt;
   providing a cooling chamber directly coupled to the furnace chamber, capable of receiving and storing a plurality of crystal boules from the furnace chamber during a single thermal cycle of the furnace chamber;
   transferring grown boules from the furnace chamber to the cooling chamber with a transfer mechanism without the need to cool the furnace chamber prior to transfer; and
   enabling the crucible assembly to replenish heated crystal melt therein via a crystal aggregate supply coupled to the crucible assembly.

18. The method of claim 17, further comprising regulating cooling temperature within the cooling chamber with a temperature regulation system.

19. The method of claim 18, further comprising decreasing cooling chamber temperature from proximal to distal the furnace chamber with the cooling temperature regulation system.

20. The method of claim 19, further comprising transporting the boules within the cooling chamber from proximal to distal the furnace chamber with a track.

21. The method of claim 17, further comprising replenishing heated crystal melt in the crucible assembly during a single thermal cycle of the furnace chamber with a crystal aggregate supply coupled to the crucible assembly.

22. The method of claim 17, further comprising discharging slag from the heated crystal melt in the crucible assembly during a single thermal cycle of the furnace chamber.

23. The method of claim 22, wherein the slag discharging is performed by tilting at least a portion of the crucible assembly.

* * * * *